United States Patent [19]

Gibson, Jr. et al.

[11] 4,112,355
[45] Sep. 5, 1978

[54] QUALITY AND FIT MEASURING APPARATUS FOR FASTENERS AND THEIR HOLES

[75] Inventors: Harry S. Gibson, Jr.; Charlie Gene Trevillion, both of Atlanta, Ga.

[73] Assignee: Lockheed Corporation, Burbank, Calif.

[21] Appl. No.: 734,805

[22] Filed: Oct. 22, 1976

[51] Int. Cl.² .......................................... G01R 27/00
[52] U.S. Cl. ............................. 324/57 R; 33/174 E; 33/143 L; 324/61 R; 324/65 R; 340/679
[58] Field of Search ............... 324/57 R, 61 R, 61 P, 324/65 R, 73 AT; 340/282; 73/291; 33/174 E, 178 E, 143 L

[56] References Cited

U.S. PATENT DOCUMENTS

| | | | |
|---|---|---|---|
| 1,860,827 | 5/1932 | Turnbull | 340/282 |
| 2,417,062 | 3/1947 | Coake | 324/61 P |
| 2,688,871 | 9/1954 | Lubinski | 340/282 X |
| 2,742,707 | 4/1956 | Jacobsen et al. | 325/65 R X |
| 2,772,411 | 11/1956 | Cooper | 340/282 |
| 3,189,268 | 6/1965 | Nilsson | 324/61 R X |
| 3,413,542 | 11/1968 | Mayer | 324/61 R |
| 3,426,272 | 2/1969 | Griffin | 324/61 R |
| 3,857,093 | 12/1974 | Green | 324/65 R |

FOREIGN PATENT DOCUMENTS 1,220,783  1/1971  United Kingdom ............ 324/61 R Primary Examiner—Stanley T. Krawczewicz
Attorney, Agent, or Firm—John J. Sullivan

[57] ABSTRACT

The tapered fastener system is one of the more reliable fastener systems for assuring the longevity of connected members, especially like those found in aircraft, which are subjected to stresses on the order of 20,000 psi and up. However, in order to achieve such joint longevity, a high quality installation of the tapered fastener has been determined to be necessary. The three areas which are the most critical to such an installation are: hole finish, fastener-to-hole bearing contact, and interference fit of fastener in hole.

The apparatus herein proposed evaluates these three factors to determine if the necessary quality level has been attained in the fabrication of the fastener and in hole preparation prior to actual installation. To this end this apparatus includes a probe and receptacle, simulating the fastener and hole respectively in conjunction with a computer and display box to electronically and instantaneously determine hole condition and comparative fastener-to-hole bearing and interference. A quick, inexpensive and accurate method of inspection for the factors noted is thus provided and consequently the cost of a quality tapered fastener installation is reduced to that of most straight shank fastener systems.

7 Claims, 11 Drawing Figures

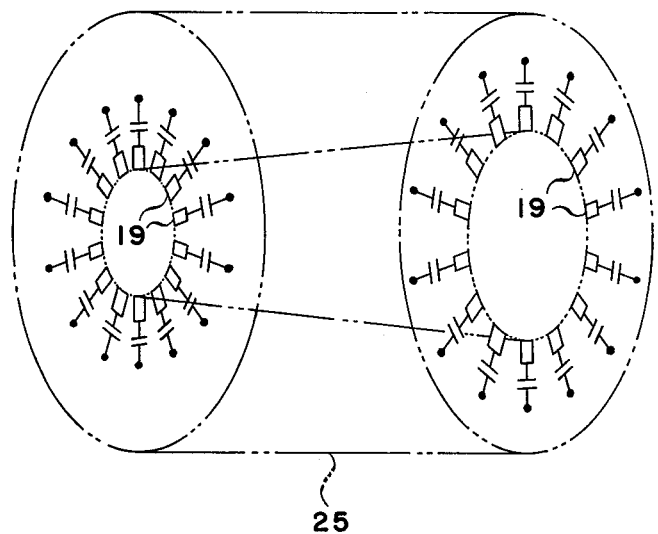
FIG. 5
FIG. 6
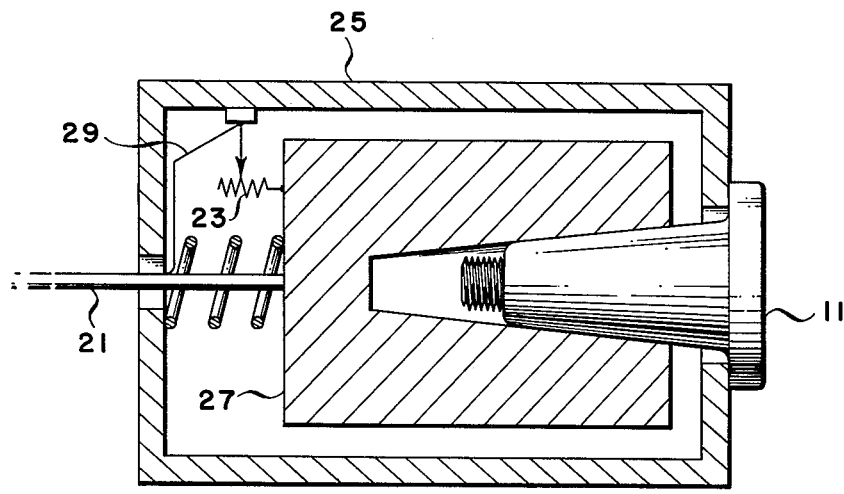

QUALITY AND FIT MEASURING APPARATUS FOR FASTENERS AND THEIR HOLES

This invention relates to fastener installations wherein structural members, especially those subjected to the higher stress levels, i.e., on the order of 20,000 psi and above, are interconnected and more particularly to an apparatus capable of determining the quality and fit of fasteners in their respective holes in the members in advance of actual installation to insure an optimum match and fit.

Tapered fasteners or pins have been utilized in the structural connection of critical joints on various aircraft over the years, notably during the past two decades, where they have met with varying degrees of success. The alloy steel tapered pin has been used extensively in relatively highly stress joints (about 30,000 psi) in wing structures, where it has performed excellently and endured countless flight hours of service. Titanium tapered pins have been used in similar installations where the greater expense thereof is justified by the weight saved due to a very high number of fasteners used per airplane.

The prime concern in the use of tapered fasteners or pins is the critical installation factors required to assure high joint fatigue endurance. Testing has indicated that poor quality installation yields very low joint fatigue endurance and the tapered pin has been found to be far more sensitive to manufacturing anomalies than other so-called fatigue rated fasteners. However, if certain factors are properly controlled the tapered pin yields the desired joint fatigue endurance at medium to highly stressed conditions and will exceed the endurance of most other fatigue rated fastener systems. The factors are: the interference fit between fastener and adjacent material, the bearing interface between fastener and adjacent material and the condition of the surface which defines the fastener hole.

The interference fit for a quarter inch diameter tapered pin, for example, must be between 0.0018 and 0.0042 inch. Interference, when lower, significantly reduces joint fatigue endurance and when higher contributes to stress corrosion. Also, test data indicate that contact between the fastener and hole surface must be at least 70% in order to achieve high joint fatigue endurance. Less contact or bearing reflects significant reductions in joint life. Hole conditions which have deleterious fatigue endurance effects are rough surface (currently considered to be above 63 root mean square), rifling, out of roundness, tool marks, scratches, curved center line, etc.

The cost of conventional means of inspecting for these conditions is relatively high. These present-day techniques involve boroscope and stylus type instruments for checking hole surface finish, dye checks of pin in hole, air gaging or single element capacitance checking for bearing determination, and a protrusion measurement for the interference determination. The necessity of this degree of inspection, the expense therefor, and the dependence upon operator judgment, has in many instances discouraged the use of tapered pins in original design where the use of tapered pins could provide a lighter, more efficient joint structure.

Furthermore, the conventional inspection methodology noted above is not considered sufficiently reliable by some designers and presents a degree of risk in critical applications. Tapered pins are nevertheless continuing to be used in critical, highly stressed installations in new design and repair applications. Therefore, the quest for greater economy and reliability in inspection methods is very important to the user.

The present invention envisions an improvement in this area of the art by the use of an apparatus which simultaneously compares the tapered pin to the hole into which it is to be installed and determines the condition of the hole. This apparatus includes a capacitance type probe with, in its preferred embodiment, segmented capacitors and a capacitance receptacle for the tapered pin also with, in its preferred embodiment, segmented capacitors. The probe determines the actual capacitance measured at each segment and this value is compared to a predetermined, ideal condition for the size, shape and smoothness of the hole. This information is fed into a computer. The receptacle measures the shape of the pin in the same manner and feeds that information into the computer. By indicating the depth of the probe in the hole and the pin in the receptacle the interference can also be predicted. The computer compares the hole quality with a pre-input standard; compares the probe and receptacle measurements of the pin and hole; and consequently predicts the bearing contact of the pin in the hole and the interference fit.

The broad concept of capacitive measurement in digital form using multiple capacitive elements is known prior art. The Geisselmann U.S. Pat. No. 3,777,257 describes a digital system using capacitive electrode pairs selectively switched, in combination with a pulse generator to actuate a counter for measurement of location and disposition. Also, the Abbe U.S. Pat. No. 3,775,679, and the Harris U.S. Pat. No. 3,400,331, discloses multiple capacitive sensor systems for measurement of dimension and an oscillator to actuate counters for digital readout.

None of the foregoing prior art teachings contemplates the use of a tapered probe and receptacle with multiple capacitive elements selectively switched in a digital system for matching a hole to the probe. This, in essence, is a principal purpose of the present invention.

The Mayer U.S. Pat. No. 3,413,542 relates to a capacitive measurement system in which the inside of an irregular surface is sensed by capacitor probes. The Mayer circuitry, therefore, is somewhat similar to that envisioned by the present invention to accomplish hole finish determination. Unlike the present apparatus the Mayer arrangement does not permit the mere insertion of a probe into the hole but requires multiple insertions as well as certain manipulations of the probe while in the hole. Moreover, in Mayer there is no means for, or intention of, comparing the pin and hole surfaces.

The apparatus herein proposed also provides a means of determining the finish of a tapered fastener hole and the size and shape of the hole at all points in the length thereof. Thus, ideal matching of the fastener or pin to be installed in the hole is assured and an ultimate joint capable of maximum stress is realized.

More specifically, the present apparatus comprises a series of probes and matching receptacles, wherein each probe and receptacle pair corresponds to a specific pin and hole of predetermined model configuration. Each pair is adapted to be operatively connected to a powered, computer-connected control which includes registers indicating comparisons made by the computer between the connected probe disposed in a workpiece hole and a pin proposed to be installed in the workpiece hole disposed within the probe-matching receptacle.

With the above and other objects in view, as will become more apparent, this invention consists in the construction, combination and arrangement of parts all as hereinafter more fully described, claimed and illustrated in the accompanying drawings, wherein:

FIG. 1 is a perspective view of an apparatus constructed in accordance with the teachings of this invention and showing the essentials thereof, viz., a selected probe and matching receptacle operatively assembled with a control and display box, the probe being illustrated in position for insertion into aligned holes in a pair of structural members to be joined and the receptacle located in the control and display box with a fastener or pin about to be inserted therein;

FIG. 5 is a schematic, perspective view of one of the receptacles alone to show the construction and arrangement of the several segments which form its passage defining surface, only one ring of such segments being shown adjacent each end of the receptacle;

FIG. 6 is a longitudinal section taken through one of the receptacles with the corresponding fastener seated therein to show the detector mechanism associated with the receptacle to measure the depth of penetration of fastener therein indicating the degree of interference fit between the fastener and the structural members;

Figure 1:
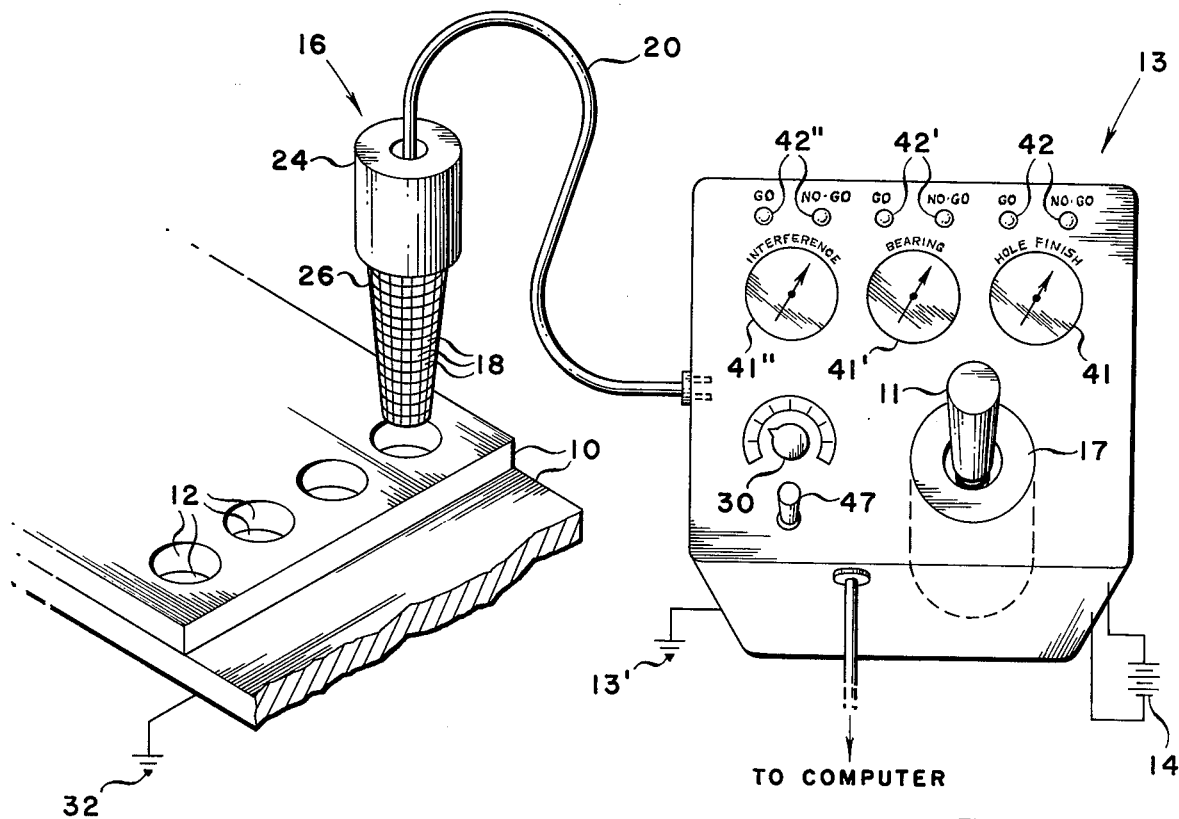
Figure 2:
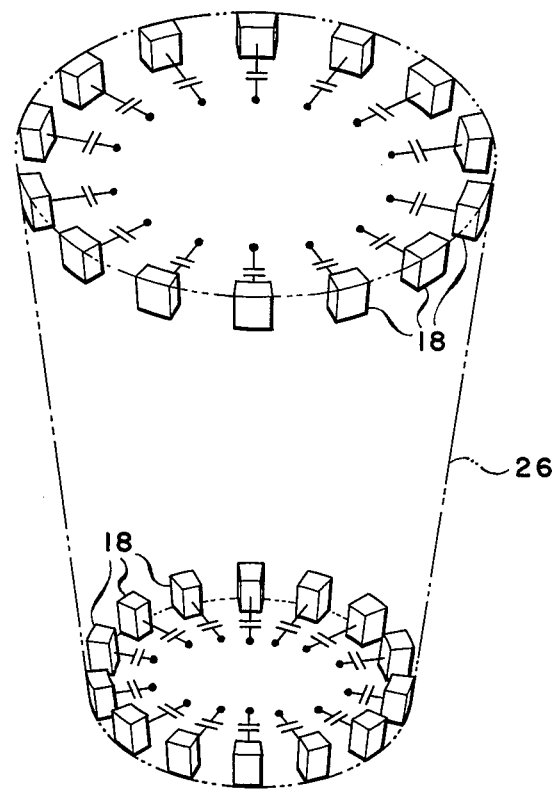
FIG. 2 is a perspective view of one of the probe elements shown in FIG. 1 to disclose schematically the construction and arrangement of the several segments which define the surface thereof, only one ring of such segments being shown adjacent each end of the probe.
Figure 3:
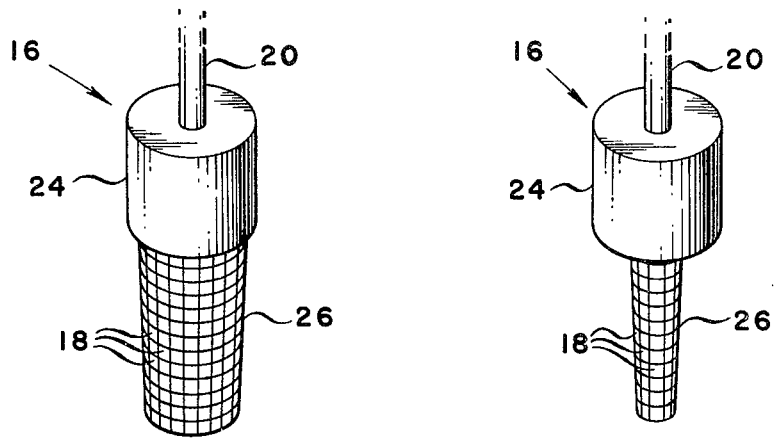
FIG. 3 is a similar view of two illustrative sizes of probe and receptacle pairs of the series contemplated to be used in the apparatus.
Figure 4:
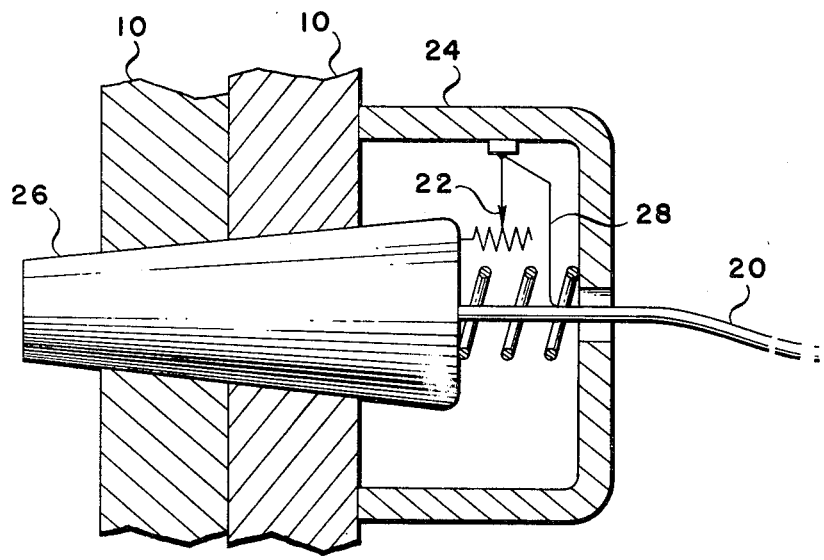
FIG. 4 is a longitudinal section taken through one of the probes inserted in the aligned holes in the structural members to be joined to show the detector mechanism associated therewith to measure the depth of penetration of the probe in the aligned holes indicating the degree of interference fit between the fastener and the structural members.
Figure 7A:
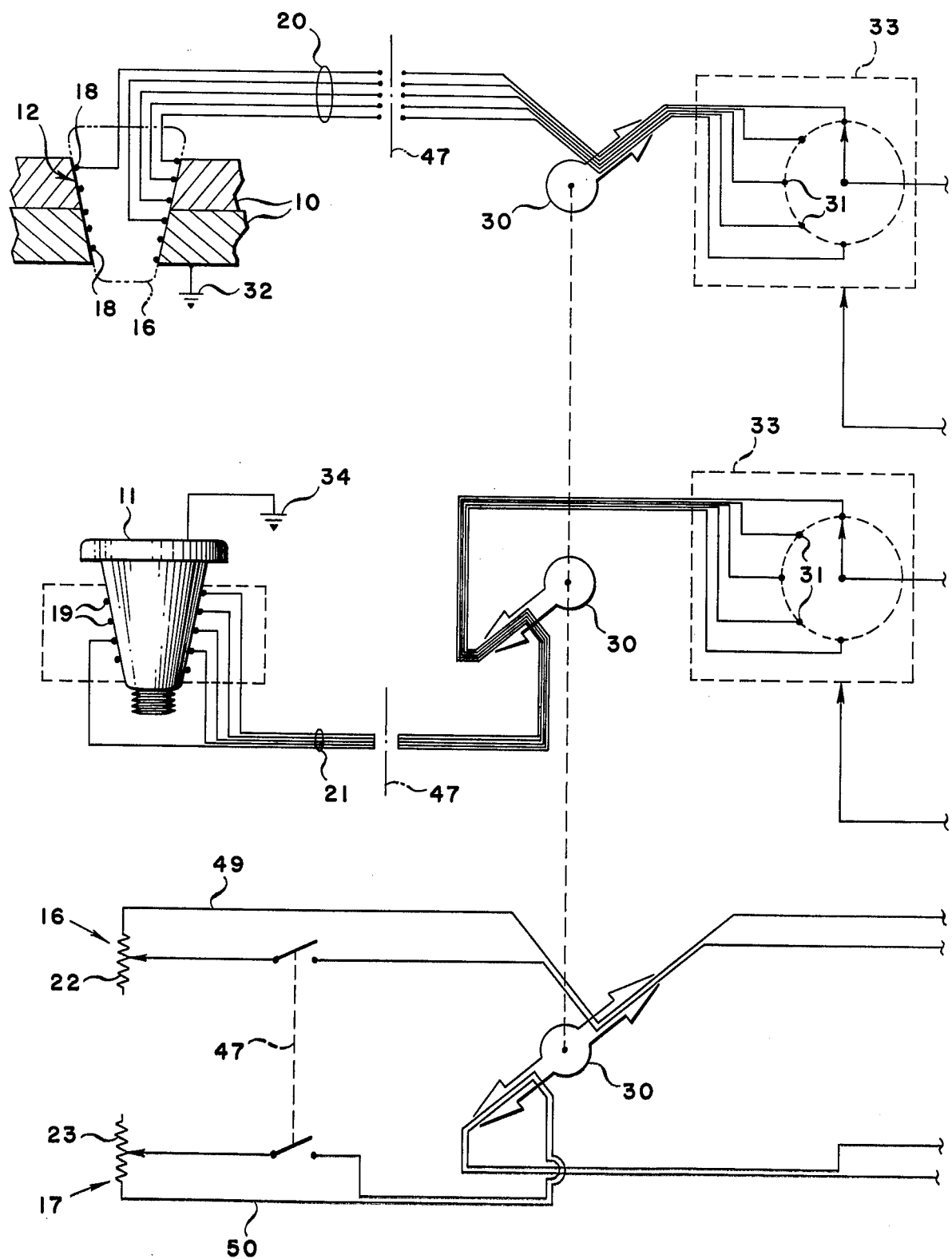
Figure 7B:
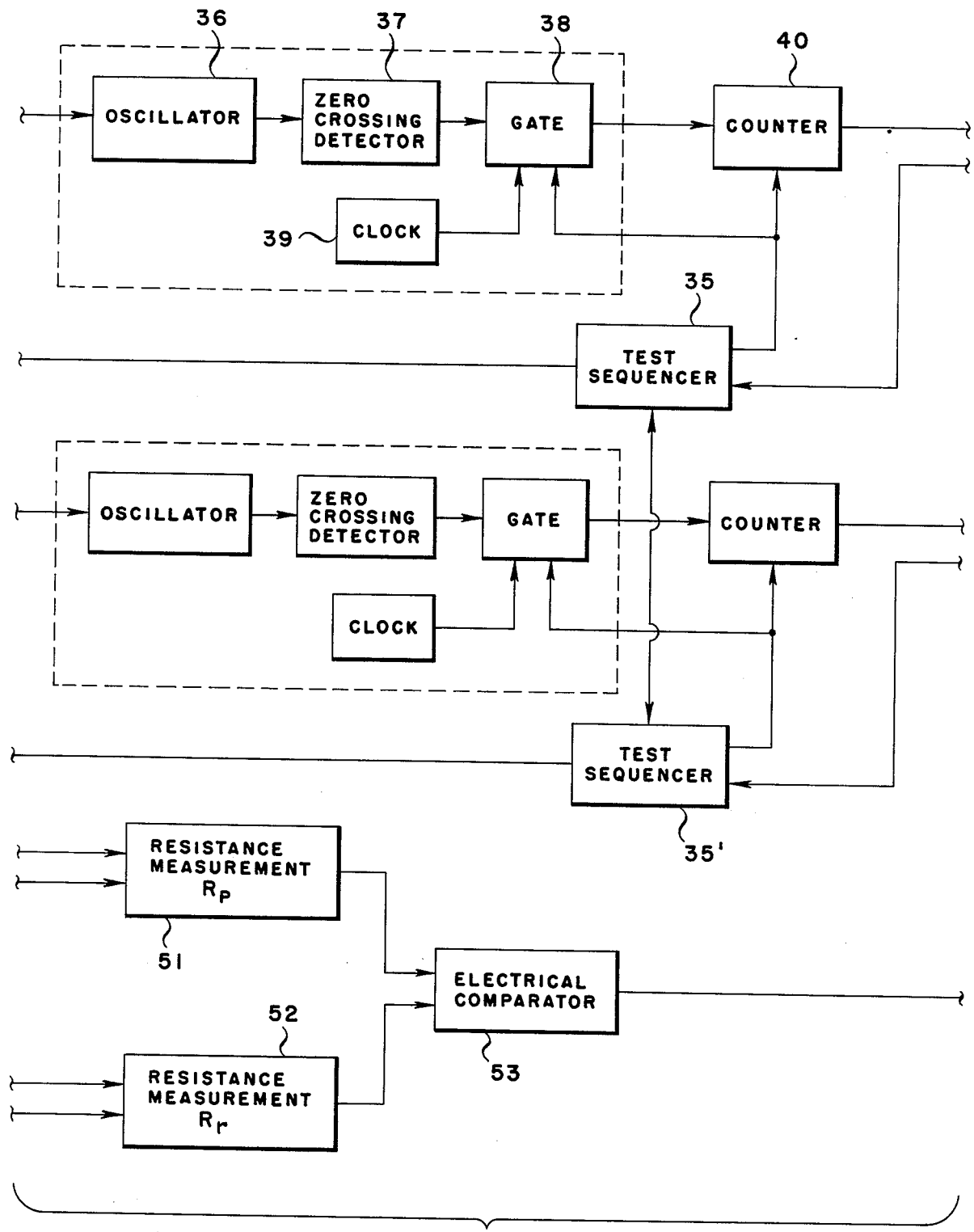
Figure 7C:
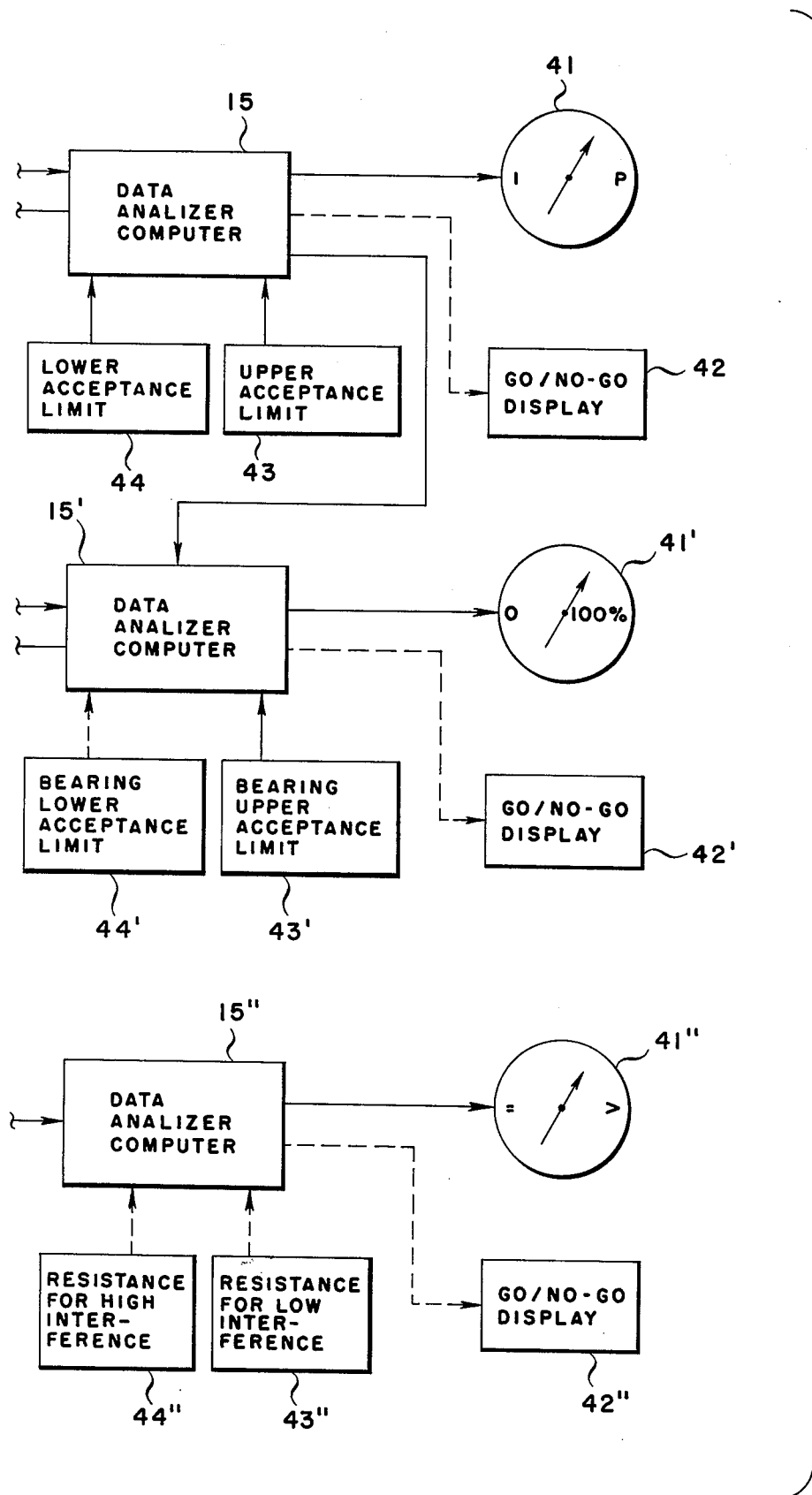
Figure 8A:
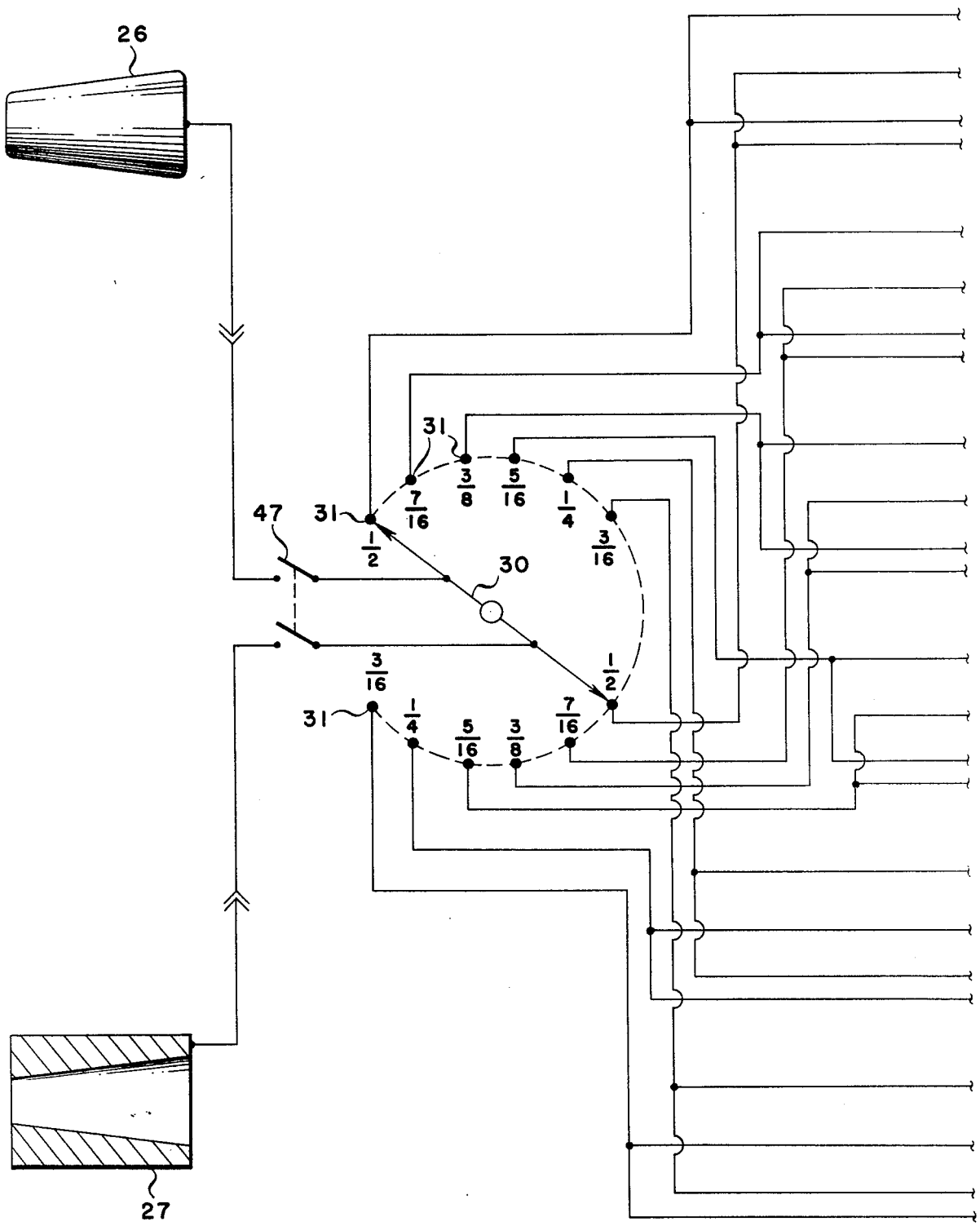
Figure 8B:
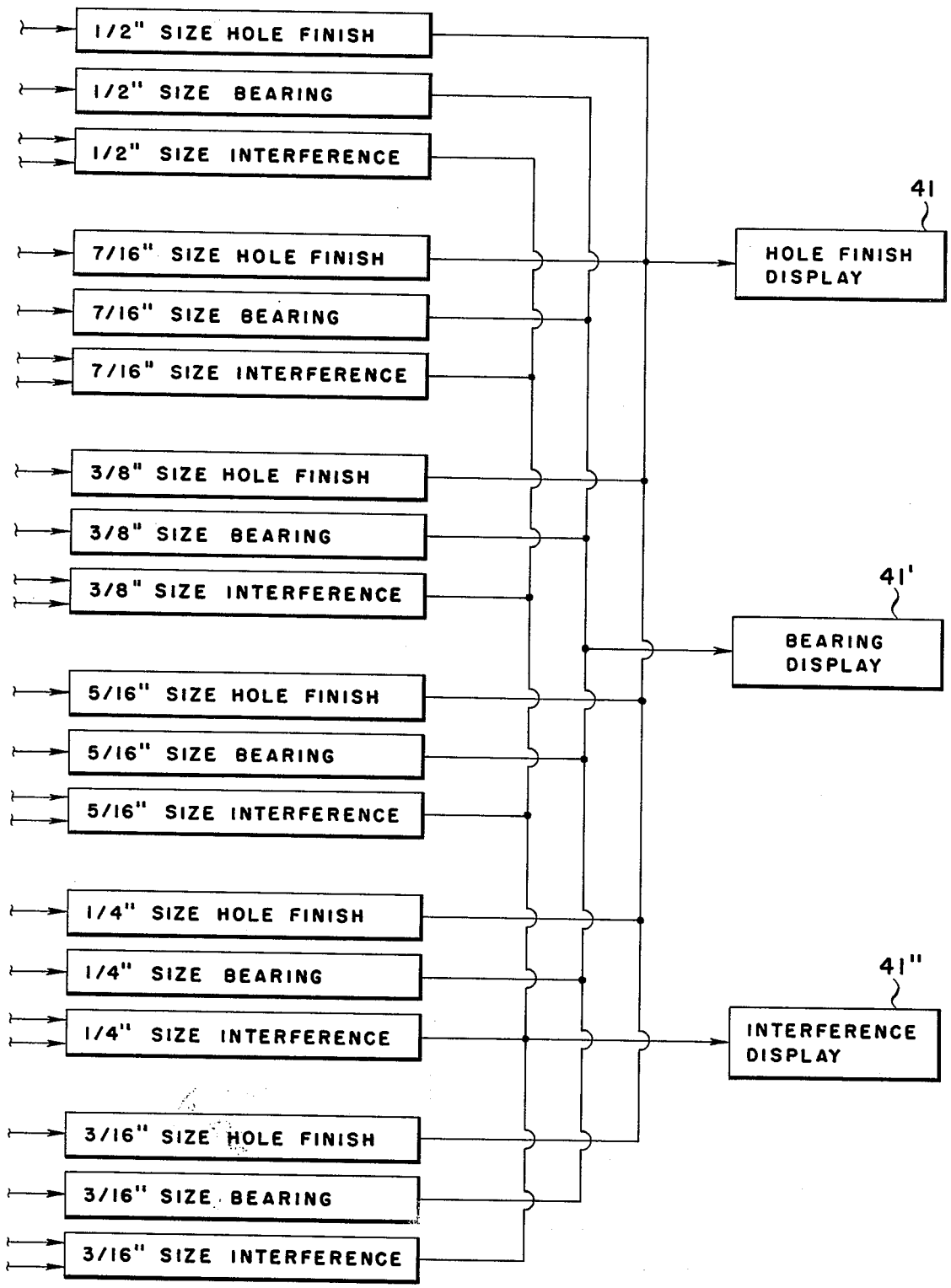

FIGS. 7A/7B/7C is an electrical schematic of the entire apparatus to show the arrangement and interconnection of the several parts thereof for a clearer understanding of the function and operation thereof; and FIGS. 8A/8B is a similar view to show the essentials of the fastener size selector switch and its integration into the apparatus of FIGS. 7A/7B/7C.

Referring more particularly to the drawings, 10 designates a pair of structural members to be interconnected by one or more fasteners or pins 11 through aligned openings 12 in the members 10. Each fastener 11 is configured with a tapered shank and the surfaces of the members 10 defining the holes 12 are correspondingly shaped being slightly undersized in the conventional manner to effect an interference fit of predetermined amount when the fastener 11 is ultimately installed.

In order to produce a connection of the structural members 10 of maximum strength and integrity it is important that the defining surfaces of the holes 12 have a smooth finish for continuous contact with the surface of the fastener or pin 11 in uniform interference fit throughout the length thereof. To these ends a quality and fit measuring apparatus is proposed which includes a control panel or box 13 suitably connected in conventional manner to a power source 14 and grounded as at 13'. The control box 13 includes fittings adapted to be operatively connected to a computer 15 as well as a pair of removable probe 16 and receptacle 17 attachments.

Each pair of probe 16 and receptacle 17 attachments are selected from a series of such attachments and correspond in size and shape to the respective surfaces of each pin 11 and the aligned holes 12 in which it is to be installed. The surface of each probe 16 and each receptacle 17 is defined by a plurality of elements in the form of capacitors 18 and 19 respectively, each connected by an appropriate conductor grouped as a bundle 20 and 21 respectively to the computer 15 through the control box 13. These capacitors 18 and 19 are preferably arranged in annular rings of spaced elements over the entire length of the probe 16 and receptacle 17 respectively with the elements in adjacent rings being offset to produce a checkerboard arrangement. Also it is noted that the external dimensions of all of the receptacles are the same so as to be interchangeable in the well provided therefor in the box 13.

Also associated with each probe 16 and receptacle 17 is a penetration or depth indicating device in the form of a variable resistor or potentiometer 22 and 23 respectively. To this end each respective probe 16 and receptacle 17 comprises a relatively stationary outer body 24 and 25 and a relatively movable spring-loaded inner body 26 and 27. The coacting elements of each potentiometer 22 and 23 are attached to and carried by the associated bodies 24 and 26 or 25 and 27 so that relative movement of these energize the associated potentiometer 22 or 23 transmitting a corresponding signal through a conductor 28 and 29 respectively incorporated into the associated bundle 20 and 21.

When the probe 16 is inserted into the holes 12, a displacement of the resistor 22 is proportional to the depth of the probe 16 in the holes 12. This is directly proportional to the amount of interference which will exist between an ideal or perfect sized pin 11 in the actual holes 12. Similarly, when the actual pin 11 is inserted into the receptacle 17 a corresponding displacement of the resistor 23 shows the amount of interference which will exist between the pin 11 and ideal or perfect sized holes 12.

The conductor bundles 20 and 21 connect at their other ends to a selector switch 30 housed within the control box 13, each individual connector comprising the bundles 20 and 21 terminating in a contact 31 of the switch 30. The switch contacts 31 each correspond to a specific fastener/probe and hole size and serve when closed to energize circuitry within the computer 15 calibrated to that particular size.

Referring more particularly to FIGS. 7A/7B/7C, with the selected size probe 16 inserted into the aligned holes 12 in the members 10 which are electrically grounded as at 32 the selector switch 30 is set accordingly, i.e., to the selected size probe 16. A signal is thereby fed into an electronic segment stepping switch 33 which thereafter connects the conductor or lead of each capacitor 18 and 19 into the computer circuitry one at a time. This switch 33 changes from one capacitor 18 and 19 to each of the others upon a signal from a test sequencer 35.

The stepping switch 33 is an electronic switch which connects the capacitors 18, each probe 16 and receptacle 17 to prescribed electronic components which may be discrete for each fastener 11 or hole 12 as necessary to condition the signal which is to be analyzed by the computer 15. The test sequencer 35 selects the signals from the individual capacitors 17 and 18 to be employed in a preselected order which occurs in a time period of a few milliseconds for all the capacitors 17 and 18. This stepping switch 33 as well as the test sequencer 35 is well within the state-of-the-art and each may be derived utilizing basic textbook data, such as outlined on pages 659 et seq., of *Electronic and Radio Engineering* by F. E. Terman, 4th Edition (1955), published by McGraw-Hill Book Co. which is hereby incorporated by reference.

For purposes of this discussion and to facilitate an understanding of the operation the signal from one capacitor 18 will be traced through the system, it being understood that each capacitor 18 acts in the same manner. The capacitance signal is fed from the stepping switch 33 into an oscillator 36 which converts it to an alternating signal of wave length determined by the value of the capacitance. The oscillator 36 is a well known design such as the Colpitts oscillator illustrated on page 522 of *Electronic Engineering*, 2nd Edition, by Alley & Atwood, published by John Wiley and Sons, Inc. The oscillating or alternating signal thus produced is transmitted into a zero crossing detector 37 which is of the conventional diode type such as the Zener diode described on page 69 of *Electronic Engineering*, 2nd Edition, by Alley & Atwood, published by John Wiley and Sons, Inc. The detector 37 provides a zero-crossing reference of the input signal and this input signal passes into a gate 38 which is of the unipolar field-effect transistor (FET) type described on pages 148 through 152 and 414 etc., of *Electronics For Scientists* by Malmstadt and Enke, published (1962) by W. A. Benjamin, Inc. The gate 38 conditions the low input signal, as regulated by clock 39 output, to allow an accurate frequency measurement by a high speed digital counter 40. The clock 39 is designed along the lines of that basic information found on pages 19 through 21 and 102 et seq., of *Microcomputer-Based Design* by John B. Peatman, published by McGraw-Hill Book Co.

A counter 40 connected to the output side of the gate 38 applies linear units of measure to the wave per units of time thereby providing an electrical impulse which is fed into the data analyzer or computer 15. The counter 40 is of the cascade binary counter type as described on pages 447 through 451 of *Electronics for Scientists* by Malmstadt and Enke, published (1962) by W. A. Benjamin, Inc. A specific model which may be utilized is the Hewlett-Packard 5245L Electronic Counter procurable from the Hewlett-Packard Company, 1820 Embarcardero Rd., Palo Alto, Calif. 94303.

The computer 15 consists of an Intel Intellec 8 Mod 80 Base Microprocessor, and an Intel SBC 80/10 Control Microcomputer available from Intel Corporation, 990 E. Arquas Ave., Suite 112, Sunnyvale, Calif. 94086 controlled through a Lear Siegler ADM-3 CRT Terminal available from Lear Siegler, Inc., Electronic Instrumentation Division, data Products, 714 N. Brookhurst St., Anahiem, Calif. 92803. The computer 15 varies sufficiently with variations of distances between the plates of the capacitors 18 of the probe 16 and the material defining the aligned holes 12 to detect differences. The computer 15 then compares this signal with a previously determined and programmed signal within the computer 15 corresponding to a perfect hole 12. The computer 15 retains this signal in its "memory" circuitry and signals the test sequencer 35 causing it to advance to the next capacitor 18 to be analyzed. The entire operation as above described for the first capacitor 18 repeats until all of the capacitors 18 of the probe 16 have been analyzed.

The computer 15 then summarizes all of the signals thus received from the several capacitors 18 from its memory circuitry and transmits a corresponding actual value signal to an indicator 41 and/or if desired to a go/no-go display, e.g., a green or red electric light 42. The indicator 41 thereby receives a signal representing an average value corresponding to the collective or mean input from the several capacitors 18. The go/no-go display 42 will indicate "go" (green) if the signal received is within the range of a predetermined value set within the computer 15 by an upper and a lower acceptable limit input 43 and 44 or "no-go" (red) if this signal is outside such a range. The finish and configuration of the aligned holes 12 in the members 10 to be joined is therefore evaluated.

The receptacle 17 for a given size tapered fastener 11 is placed into the well provided therefor in the control box 13 and the fastener 11 to be evaluated prior to installation in the aligned holes 12 in the members 10 to be joined thereby is inserted into the receptacle 17. The fastener 11 is grounded electrically as at 34 and functions similar to the probe 16 as previously described. In this case, however, the several capacitors 19 are located in the receptacle 17 defining the surface thereof adjacent the fastener 11 and connect by conductors in the bundle 21 to the same switch 33 but to a separate although similar circuit. More specifically the functions of the fastener analysis circuitry are substantially the same as but separate from the hole finish circuitry previously described with the following exceptions.

The test sequencers 35 and 35' are electrically coordinated to assure that the signals from similar locations on the surfaces of the holes 12 and the fastener 11 are being evaluated. Since the display 41' is designed to show the predicted area of contact of the fastener 11 when installed in the aligned holes 12, the data from the computer 15 is fed into the computer 15' and the upper and lower acceptable bearing limit inputs 43' and 44' are also fed into the computer 15'. The computer 15' includes circuitry which will then compare the slope and size of the aligned holes 12 from the computer 15 with the signal from the receptacle 17 and the bearing reading such that it registers the predicted area of contact in percentage of the specific fastener 11 with the specific holes 12 being evaluated. The computer 15' energizes the go/no-go display 42' to indicate "go" if the bearing contact is within the range of the predetermined value set within the computer 15' by the upper and lower acceptable limit inputs 43' and 44' or "no-go" if such contact is outside of such range.

The interference prediction circuit is energized by actuation of a measure switch 47 located, for example, on the control box 13. Thus, a circuit 49 and 50 associated with the respective potentiometers 22 and 23 is completed and current is sent through the switch 30 to a resistance measurement circuitry 51 and 52 associated with the probe 16 and receptacle 17 respectively.

The resistance measurement devices 51 and 52 measure the interference between the probe 16 and the holes 12 (Rp) and between the pin 11 and the receptacle 17 (Rr) which is then transmitted into an electrical comparator 53 and the data analizer 15". The resulting interference is thus computed indicating the ultimate interference fit of that particular pin 11 when actually installed in the particular aligned holes 12.

More specifically, a predetermined value for low interference limit and a predetermined value for high interference limit for the particular size fastener 11 are fed into the computer 15" by predetermined inputs 43" and 44" respectively. The computer 15" compares the signals received from the comparator 53 with those from the inputs 43" and 44" and if the resistances are equal or the fastener shank is smaller than the aligned holes 12 zero registers on the interference indicator 41". If the fastener shank is larger than the aligned holes 12 the actual interference registers on the indicator 41". If this measurement falls between or is equal to the predetermined value put into the computer 15" by the inputs 43" and 44" the go/no-go display 42" is energized to indicate "go". However, if this measurement is outside these limits the go/no-go display 42 is energized to indicate "no-go".

Referring specifically now to FIGS. 8A/8B the conductor bundle 20 to the selected size fastener simulator 26 is shown plugged into the display box 13 and the corresponding receptacle 27 shown operatively inserted in the display box 13. The measure or inspection switch 47 on the display box 13 is employed to activate the entire circuitry as above described and when this switch 47 is turned "on" the display 41, 41' and 41" read out immediately. When the switch 47 is released the entire circuitry clears, however delays on displays for memory holds or other functions as well known to the art may be included as desired.

A separate circuit is shown for each size fastener 11. Some of these functions may be accomplished by the same equipment but most inputs and functions vary with size thereby requiring a circuit trace through each size. For illustration the probe 16, receptacle 17, and interference circuitry simulates circuitry for sizes ½ inch diameter through 3/16 inch diameter as shown.

The fastener size selector switch 30 channels the probe 16 and receptacle 17 signals into their respective circuits. These circuits function as described in connection with FIGS. 7A/7B/7C and signal the displays 41, 41' and 41" corresponding to hole finish, bearing and interference respectively.

While the invention has been hereinabove illustrated and described in what is believed to be its best and most practical form under present-day conditions, it is recognized that under other conditions this form would be modified. No attempt has been made to specifically incorporate any of such other forms in this disclosure in the interest of clarity of the total inventive concept. The claims are relied upon to cover these other forms generally.

What is claimed is:

1. A quality and fit measuring apparatus for fasteners and their holes in structural members to be joined by such fasteners when installed therein comprising in combination:
   a control box including a source of electrical power and a plurality of indicators;
   a computer operatively connected to said control box;
   a probe having a surface conforming in size and shape to that of the shank of each said fastener, said probe surface being defined by a plurality of capacitors electrically connected to said control box;
   a receptacle having a surface conforming in size and shape to the surface of said members defining said holes, said receptacle surface being defined by a plurality of capacitors electrically connected to said control box;
   a first electrical circuit within said control box including an individual conductor between each said probe capacitor and said computer;
   a second electrical circuit within said control box including an individual conductor between each said receptacle capacitor and said computer;
   a stepping switch in each of said first and second circuits operative to make and break connection of each probe and receptacle capacitor with said computer in a predetermined sequence; and
   a connection between said first and second circuits between said stepping switch and said computer to coordinate corresponding capacitors of said probe and said receptacle during operation of the stepping switch as aforesaid when said probe is located in the structural member holes and the fastener shank aforesaid is located in said receptacle whereby comparisons between the fastener and hole surfaces are made by the computer and registered by said indicators.

2. The apparatus of claim 1 wherein said probe and receptacle capacitors are arranged in successive segmented rings around the entire area of the respective probe and receptacle with the capacitors of adjacent rings offset to form a checkerboard pattern.

3. The apparatus of claim 1 wherein said first and second electrical circuits each include an oscillator, a zero crossing detector, a time regulated gate and a counter.

4. The apparatus of claim 1 wherein said connection includes a pair of electrically coordinated test sequencers.

5. The apparatus of claim 1 wherein said probe and said receptacle constitute one pair of corresponding size selected from a series of different size pairs each electrically connectable to and disconnectable from said control box, and including a selector switch common to both of said circuits operative to make and break connection between each of said probe and receptacle pairs when electrically connected as aforesaid.

6. The apparatus of claim 1 wherein each of said indicators includes a go/no-go display.

7. The apparatus of claim 1 including a variable resistor associated with said probe and said receptacle, each resistor being responsive to the respective probe and fastener penetration in said holes and receptacle, a third electrical circuit within said control box having an individual conductor between each said resistor and said computer, and a second connection in said third circuit between said probe and receptacle resistors and the computer to coordinate the resistance values corresponding to size which are fed into said computer where they are compared with a predetermined size and registered by one of said indicators.

* * * * *